US006353334B1

(12) United States Patent
Schultz et al.

(10) Patent No.: US 6,353,334 B1
(45) Date of Patent: Mar. 5, 2002

(54) CIRCUIT FOR CONVERTING A LOGIC SIGNAL ON AN OUTPUT NODE TO A PAIR OF LOW-VOLTAGE DIFFERENTIAL SIGNALS

(75) Inventors: David P. Schultz, San Jose, CA (US); Brian Von Herzen, Carson City; Jon A. Brunetti, Stateline, both of NV (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/492,560

(22) Filed: Jan. 27, 2000

(51) Int. Cl.[7] .......................................... H03K 19/0185
(52) U.S. Cl. .............................. 326/82; 326/86; 326/30; 326/90
(58) Field of Search .............................. 326/82, 86, 30, 326/90; 327/65, 69, 82, 563

(56) References Cited

U.S. PATENT DOCUMENTS

| 5,214,320 A | * | 5/1993 | Troung ........................ 307/443 |
| 5,216,297 A | * | 6/1993 | Proebsting ................... 307/475 |
| 5,767,699 A | * | 6/1998 | Bosnyak et al. ............... 326/86 |
| 5,986,473 A | * | 11/1999 | Krishnamurthy et al. ..... 326/83 |
| 6,025,742 A | * | 2/2000 | Chan .......................... 327/108 |

OTHER PUBLICATIONS

Xilinx The Programmable Logic Data Book 1999, available from Xilinx, Inc., 2100 Logic Drive, San Jose, California 95124, pp. 3–5 to 3–7.

IEEE Standard for Low–Voltage Differential Signals (LVDS) for Scalable Coherent Interface (SCI), IEEE Std. 1596.3–1996, Jul. 31, 1996, pp. 1–30.

TIA/EIA Standard, Electrical Characteristics of Low Voltage Differential Signaling (LVDS) Interface Circuits, Mar. 1996, TIA/EIA–644, pp. 1–31.

Xilinx Application Note: Jon Brunetti and Brian Von Herzen, "Multi–Drop LVDS with Virtex–E FPGAs", XAPP231, Version 1.0, Sep. 23, 1999, pp. 1–11.

* cited by examiner

Primary Examiner—Michael Tokar
Assistant Examiner—Vibol Tan
(74) Attorney, Agent, or Firm—Arthur J. Behiel, Esq.; Edel M. Young

(57) ABSTRACT

Described are a system and method for converting a typical two-level logic signal to a pair of differential logic signals. In accordance with one embodiment, a field programmable gate array (FPGA) is configured to provide a digital signal and its complement on a pair of output terminals. A resistor network connected to these output terminals converts the complementary signals to a pair of differential signals having current and voltage levels within the range established by the LVDS specification. For maximum efficiency, the values of the resistors that make up the resistor network can be selected to match the 100 ohm input resistance exhibited by LVDS receivers.

14 Claims, 2 Drawing Sheets

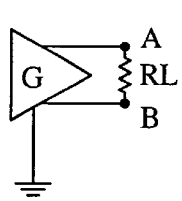
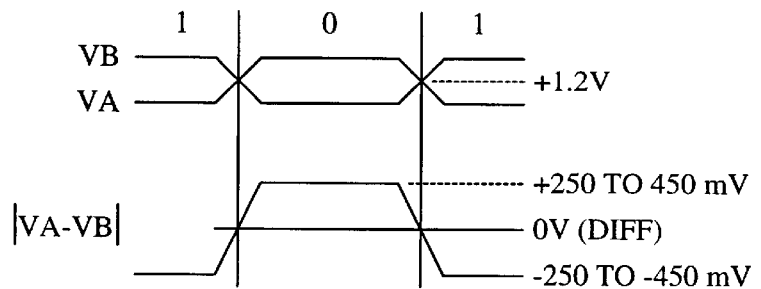
FIG. 1A
(PRIOR ART)
FIG. 1B
(PRIOR ART)
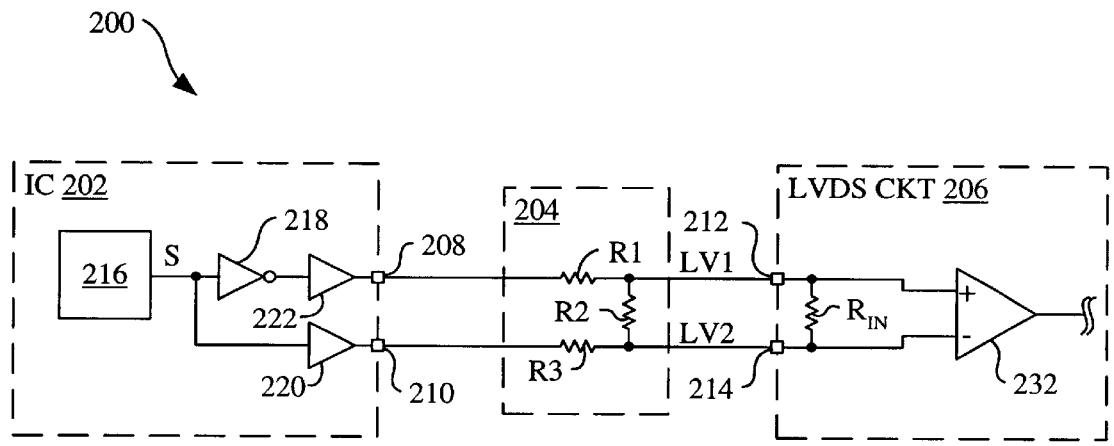
FIG. 2
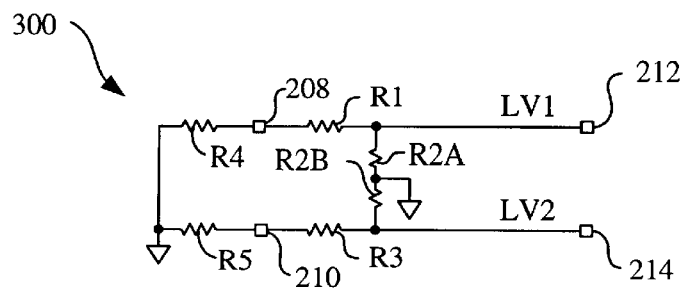
FIG. 3

CIRCUIT FOR CONVERTING A LOGIC SIGNAL ON AN OUTPUT NODE TO A PAIR OF LOW-VOLTAGE DIFFERENTIAL SIGNALS

FIELD OF THE INVENTION

This invention relates generally to methods and circuits for converting conventional digital logic signals to high-speed, low-voltage differential signals.

BACKGROUND

The Telecommunications Industry Association (TIA) published a standard specifying the electrical characteristics of low-voltage differential signaling (LVDS) interface circuits that can be used to interchange binary signals. LVDS employs low-voltage differential signals to provide high-speed, low power data communication. The use of differential signals allows for cancellation of common-mode noise, and thus enables data transmission with exceptional noise immunity. For a detailed description of this LVDS standard, see "Electrical Characteristics of Low Voltage Differential Signaling (LVDS) Interface Circuits," TIA/EIA-644 (March 1996), which is incorporated herein by reference.

FIG. 1A (prior art) illustrates an LVDS generator G having differential output terminals A and B connected to opposite terminals of a 100 ohm load resistor RL. FIG. 1B (prior art) is a waveform diagram depicting the signaling sense of the voltages appearing across load resistor RL.

LVDS generator G produces a pair of differential output signals VA and VB. The LVDS standard requires that these signals be in the range of 250 mV to 450 mV across the 100 ohm load resistor RL, and that the voltage midway between the two differential voltages remains at approximately 1.2 volts. As depicted in FIGS. 1A and 1B, to represent a binary one, terminal A of generator G is negative with respect to terminal B, and to represent a binary zero, terminal A is positive with respect to terminal B.

Some conventional integrated circuits (ICs) are adapted to provide differential output signals that conform to the LVDS specification. However, ICs that provide two-level logic signals on single output pins are more common. In some systems there may be a need to communicate signals between a circuit that does not conform to the LVDS specification and a circuit that does conform. There is therefore a need for a means of converting single logic signals to LVDS and other types of differential logic signals.

SUMMARY

The present invention addresses the need for a means of converting typical two-level logic signals to differential logic signals. In accordance with one embodiment, a field programmable gate array (FPGA) is configured to provide a digital signal and its complement on a pair of output pins. A resistor network connected to these output pins converts the complementary signals to a pair of differential input signals having current and voltage levels within the range established by the LVDS specification. For maximum efficiency, the values of the resistors that make up the resistor network can be selected to match the 100 ohm input resistance exhibited by LVDS receivers.

This summary does not limit the invention, which is instead defined by the appended claims.

BRIEF DESCRIPTION OF THE FIGURES

FIG. 1A (prior art) illustrates an LVDS generator G having differential output terminals A and B connected to opposite terminals of a 100 ohm load resistor RL.

FIG. 1B (prior art) is a waveform diagram depicting the signaling sense of the voltages appearing across load resistor RL in FIG. 1A.

FIG. 2 depicts a system 200 configured in accordance with the invention.

FIG. 3 is an AC equivalent circuit 300 representing the output impedance of network 204 and IC 202 of FIG. 2.

DETAILED DESCRIPTION

Figure 4:
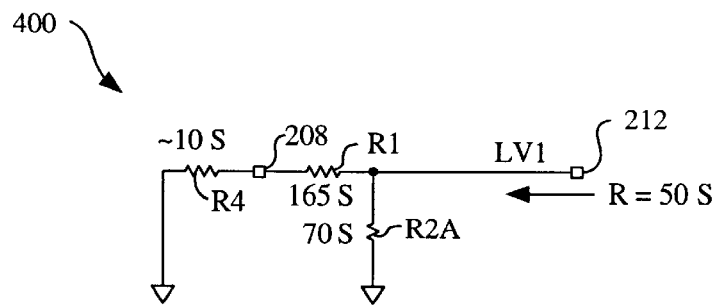
FIG. 4 represents one half of circuit 400 of FIG. 3.

FIG. 2 depicts a system 200 configured in accordance with one embodiment of the invention. System 200 includes an IC 202 connected via a resistor network 204 to an LVDS receiving circuit 206. IC 202 is a field-programmable gate array (FPGA) or other device that produces two-level logic signals on a pair of output pins 208 and 210. In the depicted embodiment, the logic levels on pins 208 and 210 represent digital values of one and zero with voltage levels of approximately 2.5 volts and zero volts, respectively. Resistor network 204 connects output pins 208 and 210 to respective input pins 212 and 214 of receiving circuit 206. Receiving circuit 206 is adapted to receive LVDS signals that conform to the LVDS specification cited above in the background section.

IC 202 includes a signal source 216 producing a digital signal S. Signal source 216 includes any circuitry that produces a digital signal. The output of signal source 216 connects to an input terminal of an inverter 218 and an input terminal of an output buffer 220. The output terminal of inverter 218 connects to a second output buffer 222. The output terminals of buffers 220 and 222 connect to output pins 208 and 210 to provide the signal S and its complement /S on respective output pins 210 and 208. In the depicted embodiment, the signals on output pins 208 and 210 alternate between approximately zero and 2.5 volts.

Resistor network 204 includes resistors R1, R2, and R3. As discussed below in connection with FIGS. 3 and 4, resistor network 204 converts complementary signals S and /S to LVDS-compatible input signals LV1 and LV2. The LVDS-compatible signals LV1 and LV2 are then presented on input pins 212 and 214 of LVDS circuit 206.

LVDS circuit 206 can be any circuit adapted to accept differential input signals that conform to the LVDS standard. LVDS circuit 206 includes a 100 ohm input resistor $R_{IN}$ connected between pins 212 and 214 in parallel with resistor R2 and connected across a pair of differential input terminals of a differential amplifier 232. Input resistor $R_{IN}$ can be either internal or external to LVDS circuit 206.

It is important to match the output impedance of resistor network 204 with the impedance of the transmission lines and with the impedance of input resistor $R_{IN}$. The respective resistances of resistors R1, R2, and R3 are therefore selected to provide a collective output impedance of 100 ohms. In one embodiment, resistors R1 and R3 are 165 ohms, and resistor R2 is 140 ohms.

FIG. 3 is an AC equivalent circuit 300 representing the output impedance of network 204 and IC 202. Circuit 300 includes resistors R4 and R5 that represent the respective output impedances of buffers 222 and 220. The values of resistors R4 and R5 are typically between five and ten ohms each. Circuit 300 illustrates that, from the perspective of differential input pins 212 and 214, resistor R2 can be modeled as two equal resistances R2A and R2B bisected by a virtual ground. Input resistor $R_{IN}$ can similarly be modeled as two equal resistances (not shown) bisected by a virtual ground.

FIG. 4 depicts a resistor network 400 representing one half of resistor network 300 of FIG. 3. Series resistors R4 and R1 combined provide approximately 175 ohms. This resistance is connected in parallel with the 70-ohm resistance R2A. The combined resistances provide a total output resistance of approximately $1/[(1/175)+(1/70)]=50$ ohms. This value, combined with the other half circuit (i.e., resistors R2B, R3, and R5), matches the input resistance of LVDS circuit 106 provided by the 100 ohm input resistor $R_{IN}$. The second half circuit is identical to the first; an analysis of the second half circuit is therefore omitted for brevity.

In addition to providing an appropriate output resistance, the values of resistors R1, R2, and R3 are selected to pass an appropriate level of current so that the voltage developed across pins 212 and 214 remains between the 250 and 450 mV levels required by the LVDS specification. The resistance values of FIG. 4 produce a voltage approximately midway between 250 and 450 mV, allowing for some margin of error, particularly in the output voltages on pins 208 and 210 and the resistance values of output resistances R4 and R5. In one embodiment, resistors R1, R2, and R3 are precision resistors having 1% tolerances. Resistors R1, R2, and R3 can be external or internal to IC 202. In one embodiment, sets of these resistors are manufactured as custom parts for use with circuits that include multiple sets of complementary output pins.

The complementary signals on pins 208 and 210 should transition simultaneously. In one embodiment in which IC 202 is a Virtex-E FPGA available from Xilinx, Inc. (Virtex is a trademark of Xilinx, Inc.), the signals S and /S are routed through special switch boxes that provide very similar signal propagation delays for the paths from signal source 216 (FIG. 2) to each of pins 208 and 210. If necessary, the routing of the two signal paths can be manipulated to produce very closely matched signal propagation delays. Selecting appropriate routing to achieve matched delays is within the skill of those familiar with programming programmable logic devices, including FPGAs.

Figure 5:
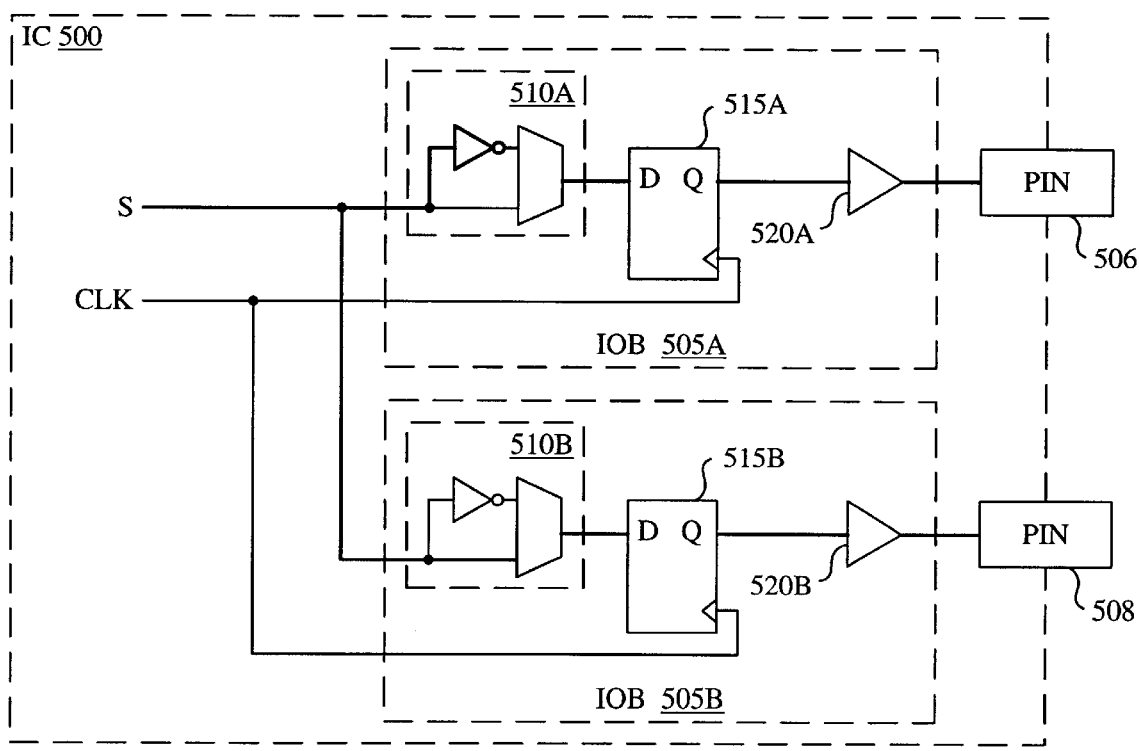
FIG. 5 depicts an FPGA 500 configured to output complementary signals for conversion by network 204 into LVDS signals.

FIG. 5 depicts an FPGA 500 that may be configured to output complementary signals for conversion by network 204 (FIG. 2) into LVDS signals. FPGA 500 includes a pair of programmable output circuits 505A and 505B connected to respective pins 506 and 508. In one embodiment, each of output circuits 505A and 505B is a programmable input/output block in a Virtex-E FPGA. For a detailed description of an exemplary input/out block for use in the present invention, see "The Programmable Logic Data Book," pp. 3–5 to 3–7, (1999), available from Xilinx, Inc., of San Jose, Calif., and incorporated herein by reference.

Output circuit 505A includes a programmable inverter 510A, a flip-flop 515A, and an output buffer 520A. Programmable inverter 510A includes an inverter and a two-input multiplexer. The multiplexer can be conventionally programmed to pass the signal presented on either input terminal. In the present example, programmable inverter 510A is programmed to pass the signal output from the inverter, as indicated by the signal path represented using relatively bold lines. Thus configured, that data terminal of flip-flop 515A receives an inverted version of signal S. Flip-flop 515A also includes a clock terminal connected to a clock line CLK and a output terminal Q connected through output buffer 520A to pin 506.

Output circuit 505B is identical to output circuit 505A, like elements being labeled using the same numbers but ending with the letter "B." When configured to produce differential output signals, programmable inverter 510B of output circuit 505B is configured to pass the signal S to the data terminal of flip-flop 515B without inverting the signal. The signal path is again represented using relatively bold lines.

Flip-flops 515A and 515B are clocked by the same clock signal CLK, and are therefore synchronized with each other. This ensures that the complementary signals on pins 506 and 508 transition at the same time. This embodiment requires that flip-flops 515A and 515B be clocked at twice the data frequency, which may be undesirable in some applications. Other types of sequential logic elements can be used to ensure that the complementary signals on pins 506 and 508 transition simultaneously, as will be apparent to those of skill in the art.

In another embodiment of the invention, resistors equivalent to R1, R2, and R3 of FIG. 2 are included within the IC device. Whereas it is difficult to manufacture IC devices having resistors with accurate and repeatable resistance values, it is possible to make several resistors within an IC for which the ratios of resistance are reliably controlled. In such an embodiment, the termination resistor equivalent to resistor R2 of FIG. 2 is actually a transistor operating in its linear range with its gate controlled to produce a resulting output resistance of about 100 ohms.

The present invention can be adapted to supply complementary LVDS signals to more than one LVDS receiver. For details of one such implementation, see "Multi-Drop LVDS with Virtex-E FPGAs," XAPP231 (Version 1.0) by Jon Brunetti and Brian Von Herzen (Aug. 23, 1999), which is incorporated herein by reference.

While the present invention has been described in connection with specific embodiments, variations of these embodiments will be obvious to those of ordinary skill in the art. For example, while described in the context of programmable logic devices, a method in accordance with the invention could be applied to other types of circuits. Moreover, the present invention can be adapted to convert typical dual-voltage logic signals to other types of differential signals, such as those specified in the Low-Voltage, Pseudo-Emitter-Coupled Logic (LVPECL) standard. Therefore, the spirit and scope of the appended claims should not be limited to the foregoing description.

What is claimed is:

1. A system comprising:
   a. a programmable logic device having differential drive circuitry, the drive circuitry including:
      i. a signal source adapted to provide a digital voltage signal that transitions between first and second voltage levels;
      ii. an inverter having an inverter input terminal and an inverter output terminal, wherein the inverter input terminal connects to the signal source;
      iii. a first output pin connected to the inverter output terminal; and
      iv. a second output pin connected to the signal source;
   b. a resistor network connected to the drive circuitry and having:
      i. a first resistor having first and second terminals, wherein the first terminal connects to the first output pin;
      ii. a second resistor having first and second terminals, wherein the first terminal connects to the second terminal of the first resistor;

iii. a third resistor having first and second terminals, wherein the first terminal connects to the second terminal of the second resistor and the second terminal connects to the second output pin; and c. a differential circuit having first and second differential input terminals, wherein the first differential input terminal connects to the first terminal of the second resistor and the second differential input terminal connects to the second terminal of the second resistor.

2. The system of claim 1, wherein the second resistor exhibits a first resistance, and wherein the differential circuit exhibits an input resistance of less than the first resistance.

3. The system of claim 2, wherein the input resistance is approximately 100 ohms.

4. The system of claim 1, further comprising:
   a. a first sequential logic element having an input terminal connected to the inverter output terminal and an output terminal connected to the first output pin; and
   b. a second sequential logic element having an input terminal connected to the signal source and an output terminal connected to the second output pin.

5. The system of claim 4, wherein each of the first and second sequential logic elements include a clock terminal, and wherein each clock terminal is adapted to receive a common clock signal.

6. The system of claim 4, wherein the sequential logic elements are flip-flops.

7. A differential-signal generator comprising:
   a. an input node adapted to receive a logic signal;
   b. an inverter having:
      i. an inverter input terminal connected to the input node; and
      ii. an inverter output terminal; and
   c. a resistor network having a plurality of resistors connected in series between the input node and the inverter output node.

8. The generator of claim 7, wherein the plurality of resistors comprises:
   a. a first resistor having:
      i. a first terminal connected to the input node; and
      ii. a second terminal;
   b. a second resistor having:
      i. a first terminal connected to the second terminal of the first resistor; and
      ii. a second terminal; and
   c. a third resistor having:
      i. a first terminal connected to the second terminal of the second resistor; and
      ii. a second terminal connected to the inverter output node.

9. The generator of claim 8, wherein the first and third resistors have respective first and second resistance values that are substantially equal.

10. The generator of claim 9, wherein the resistance values are each approximately one-hundred sixty five ohms.

11. The generator of claim 9, wherein the second resistor has a third resistance value less than the first resistance value.

12. The generator of claim 9, wherein the first and third resistors have respective resistance values of approximately one-hundred sixty five ohms, and wherein the second resistor has a resistance value of approximately one-hundred forty ohms.

13. The generator of claim 12, further comprising a fourth resistor connected in parallel with the second resistor.

14. The generator of claim 13, wherein the fourth resistor has a resistance value of approximately one hundred ohms.

* * * * *